(12) United States Patent
Johnson et al.

(10) Patent No.: US 6,341,071 B1
(45) Date of Patent: Jan. 22, 2002

(54) STRESS RELIEVED BALL GRID ARRAY PACKAGE

(75) Inventors: Eric A. Johnson, Greene; John S. Kresge, Binghamton, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/272,517

(22) Filed: Mar. 19, 1999

(51) Int. Cl.$^7$ .............................. H05K 1/11; H05K 7/06
(52) U.S. Cl. .................. 361/767; 361/768; 361/774; 29/840; 29/846; 228/180.22; 174/255
(58) Field of Search .................. 361/767, 768, 361/774, 748; 257/701, 702, 703, 737–739, 773; 174/255, 250, 253, 260; 438/125; 29/830, 846–849, 840; 228/180.22

(56) References Cited

U.S. PATENT DOCUMENTS

| | | |
|---|---|---|
| 3,874,072 A | 4/1975 | Rose et al. |
| 3,997,963 A | 12/1976 | Rieseman |
| 4,514,751 A | 4/1985 | Bhattacharya |
| 4,581,680 A * | 4/1986 | Garner ........................ 361/768 |
| 4,685,998 A | 8/1987 | Quinn et al. |
| 4,761,386 A | 8/1988 | Buynoski |
| 4,814,295 A * | 3/1989 | Mehta ........................ 438/125 |
| 4,855,257 A | 8/1989 | Kouda |
| 5,023,205 A | 6/1991 | Reche |
| 5,206,186 A | 4/1993 | Neugebauer et al. |
| 5,453,580 A * | 9/1995 | Franke et al. ................ 174/250 |
| 5,517,756 A | 5/1996 | Shirai et al. |
| 5,587,336 A | 12/1996 | Wang et al. |
| 5,621,246 A * | 4/1997 | Motoyama .................... 257/739 |
| 5,635,424 A | 6/1997 | Rostoker et al. |
| 5,672,260 A | 9/1997 | Carey et al. |
| 5,726,079 A | 3/1998 | Johnson |
| 5,744,759 A | 4/1998 | Ameen et al. |
| 5,828,555 A * | 10/1998 | Itoh ............................ 361/748 |
| 5,959,846 A * | 9/1999 | Noguchi et al. ............. 361/748 |
| 6,002,590 A * | 12/1999 | Farnworth et al. .......... 257/738 |
| 6,064,576 A * | 5/2000 | Edwards et al. ............. 361/768 |
| 6,097,091 A * | 8/2000 | Ohsumi ....................... 257/773 |
| 6,160,713 A * | 12/2000 | Floyd et al. ................. 361/760 |

OTHER PUBLICATIONS

"High Performance Carrier Technology: Materials And Fabrication", by Light et al, 1993 International Electronics Packaging Conference, San Diego, California, vol. One.
"High Performance Carrier Technology", by Heck et al, 1993 International Electronics Packaging Conference, San Diego, California, vol. One.
"Process Considerations in the Fabrication of Teflon Printed Circuit Boards", by Light et al, 1994 Proceedings, 44 Electronic Components & Technology Conference, 5/94.

* cited by examiner

*Primary Examiner*—Jayprakash N. Gandhi
*Assistant Examiner*—John B. Vigushin
(74) *Attorney, Agent, or Firm*—Schmeiser, Olsen & Watts; Lawrence R. Fraley

(57) ABSTRACT

A method and structure for reducing thermally induced strains on the solder joints that couple a ball grid array (BGA) module to a circuit card, so as to improve the fatigue life of the BGA module. The thermally induced strains arise from a mismatch in thermal expansion coefficient between the dielectric substrate of the BGA module and the dielectric board of the circuit card. The method generates void annular regions around portions of the BGA dielectric substrate to which the BGA solder balls are to be attached and/or around portions of the circuit card dielectric material to which the BGA module is to be attached. This results in the formation of dielectric islands or peninsulas that bound the solder balls of the BGA module after installation on the circuit card. The dielectric islands or peninsulas thus formed serve to increase the effective height over which the differential expansion is accommodated, thereby reducing the strains throughout the solder joints. Additionally, the void annular regions provide space for the deformation of the dielectric islands or peninsulas, thereby increasing their compliance and transferring strain from the solder joints to the dielectric islands or peninsulas.

21 Claims, 8 Drawing Sheets

STRESS RELIEVED BALL GRID ARRAY PACKAGE

BACKGROUND OF THE INVENTION

1. Technical Field

The present invention relates to a structure and associated method of fabrication that reduces thermally induced strains in solder joints associated with solder balls that couple a ball grid array (BGA) module to a circuit card.

2. Related Art

A contemporary circuit board configuration may have a BGA module mounted on a circuit card. A BGA module comprises a substrate of dielectric material, such as ceramic or plastic, having both a top surface and a bottom surface. An array of solder balls are attached to a corresponding array of conductive pads on the bottom side of the BGA module, while one or more chips are attached to the top side of the BGA module. The pertinent circuit card is any pre-wired board comprising dielectric material and an array of conductive pads on the board. An example of a circuit card is a motherboard of a computer. The circuit card pads serve as attachment points for accommodating one or more BGA modules. Accordingly, a BGA module that is mounted on a circuit board has each solder ball attached to a conductive pad on the BGA module itself and also to a conductive pad on the circuit card. These conductive pads are respectively affixed to the dielectric substrate of the BGA module and the dielectric board of the circuit card. Thus, each solder ball is a structural element that is mechanically attached to dielectric sheets of material on each side of the solder ball.

When the circuit card is heated or cooled, the solder ball is subject to strains that arise from the differential rate of thermal expansion of the supporting dielectric structures. For example, a typical thermal expansion coefficient of the circuit card is 14 to 22 ppm/° C. (ppm denotes parts per million), while a ceramic substrate of a BGA module may have a smaller thermal expansion coefficient of approximately 6 to 11 ppm/° C. If the BGA module uses a plastic substrate material, the effective thermal expansion coefficient of the plastic substrate, at locations where a silicon chip constrains expansion of the substrate, is typically about 7 ppm/° C. While the preceding materials, and corresponding thermal expansion coefficients, typify BGA substrates and circuit cards, materials could be characterized by a reversed relationship in which the BGA substrate has a higher thermal expansion coefficient than that of the circuit card to which the BGA module is attached.

Unfortunately, strains on the solder balls resulting from the aforementioned differential thermal expansion may cause fatigue failure in the BGA solder joints. U.S. Pat. No. 5,726,079 (Johnson, Mar. 10, 1998), which is hereby incorporated by reference, discloses an approach that could be used to reduce the effect of differential thermal expansion. With this alternative approach, a chip mounted on a substrate is encased peripherally with a dielectric material that is mechanically bonded to the substrate. Additionally, the chip is mechanically coupled to a conductive plate located above the top side of the chip, wherein the conductive plate comprises a material such as a stainless steel. Because of the mechanical bonding between the conductive plate and the substrate through the encased dielectric material, bending of the structure due to the differential thermal expansion is eliminated and the thermal expansion of the conductive plate mitigates the thermal expansion of the substrate of the BGA module. Thus the material of the conductive plate would be selected to have a thermal expansion coefficient that would eliminate the bending that arises from the mismatched thermal expansions of the substrate of the BGA module and the dielectric board of the circuit card. Although this method would greatly extend the BGA fatigue life, it would also increases the product's cost because of the cost of the conductive plate and because of the process steps and associated equipment required to fabricate the encasing structure.

SUMMARY OF THE INVENTION

The present invention provides an inexpensive method, and an associated electrical structure, that reduces the thermally induced strain on solder balls of BGA modules, wherein the BGA module is mounted on a circuit card. The essence of the method is to increase the effective length of the connecting structure, between the BGA module and the circuit card, that deforms due to differential thermal expansion. This results in a reduction in strain in the connecting structure and, in particular, in the solder ball. Thus, increasing the length over which a given displacement acts effectively reduces the strain throughout the solder ball. In particular, the method of the present invention forms annular voids by removing material from the dielectric substrate of the BGA module so as to leave the solder balls affixed to regions of dielectric material, wherein the regions of dielectric material are each substantially surrounded by an annular void thus formed. Annular voids may be similarly formed around the regions of the dielectric board of the circuit card, wherein the regions are underneath the conductive pads of the circuit card to which the BGA module will be attached. Thus, the method forms peninsulas of dielectric regions if the formed annular voids substantially, but not completely, surround the dielectric regions. Alternatively, the method forms islands of dielectric regions if the formed annular voids totally surround the dielectric regions. A peninsula thus formed will be unseparated from the remaining dielectric substrate (or board), thereby leaving a thin connecting dielectric strip between the peninsula and the remaining dielectric substrate (or board).

Generally, the present invention provides a method for forming at least one electrical structure, comprising the steps of:

providing a substrate including a dielectric layer having a first surface, and at least one electrically conductive pad attached to the first surface; and removing a first portion of the dielectric layer to form a void portion of the dielectric layer, wherein the void portion substantially surrounds a second portion of the dielectric layer, and wherein the pad is positioned on the second portion.

The present invention generally provides at least one electrical structure, comprising:

a substrate including a dielectric layer having a first surface;

at least one electrically conductive pad attached to the first surface; and a void portion of the dielectric layer, wherein the void portion substantially surrounds a second portion of the dielectric layer, and wherein the pad is positioned on the second portion.

The present invention has several advantages. The present invention protects the integrity of solder joints to extend the fatigue life of BGA modules. The method of the present invention is inexpensive compared with other methods, such as that of U.S. Pat. No. 5,726,079 (discussed previously in Related Art section). Moreover, the present invention does

DETAILED DESCRIPTION OF THE INVENTION

Figure 1:
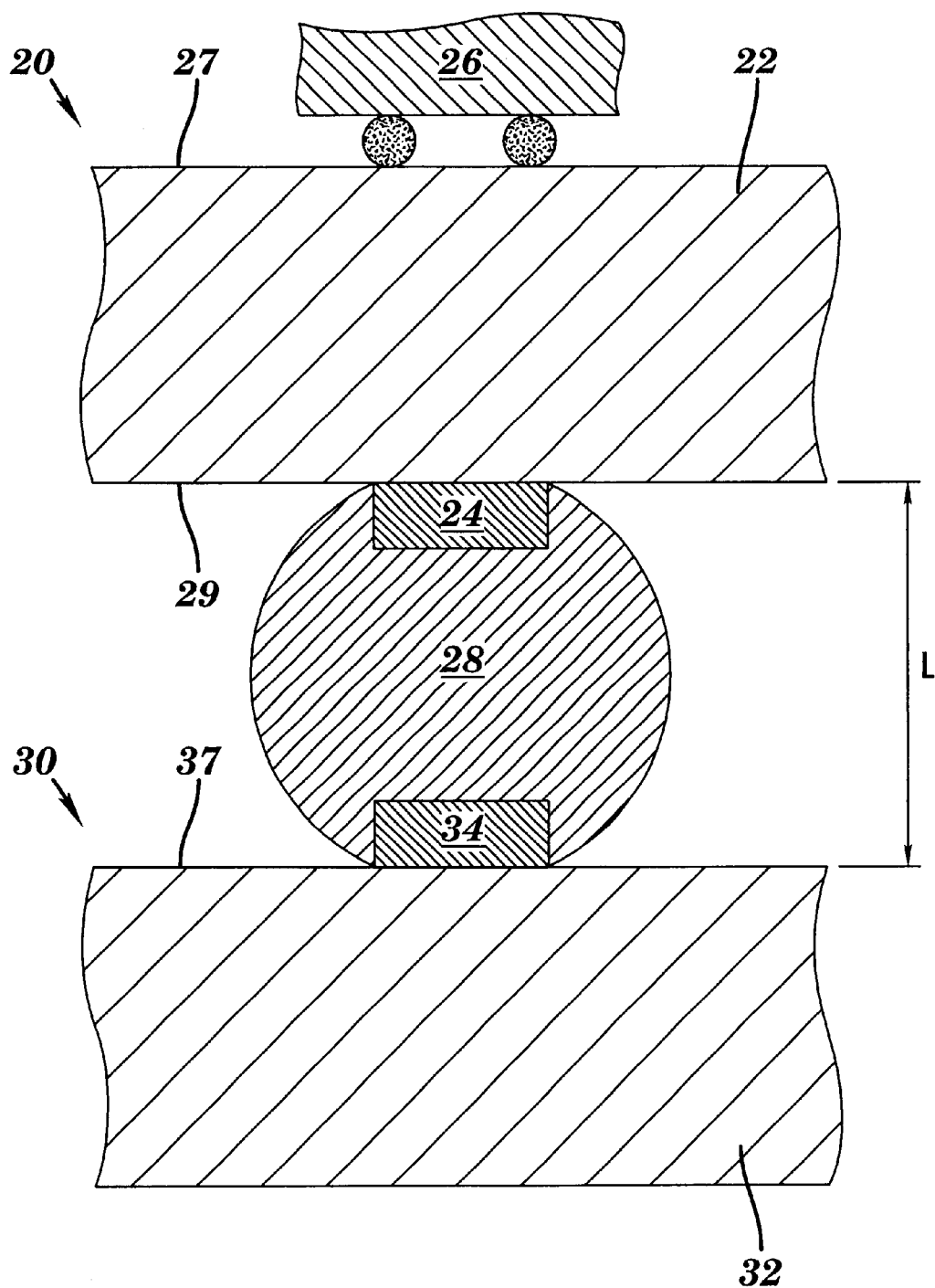
FIG. 1 depicts a front cross-sectional view of a BGA module attached to a circuit card.

FIG. 1 illustrates a front cross-sectional view of a BGA module 20 attached to a circuit card 30. The BGA module 20 comprises a dielectric substrate 22, a chip 26 attached to a top side 27 of the substrate 22, a BGA pad 24 attached to a bottom side 29 of the substrate 22, and a solder ball 28 of height L attached to the BGA pad 24. The circuit card 30 comprises a dielectric board 32 and a circuit card pad 34 attached to a top side 37 of the board 32. The circuit card may be any pre-wired board comprising dielectric material, such as a motherboard of a computer. The solder ball 28 is attached to pad 34 on circuit card 30, thereby connecting the BGA module 20 to the circuit card 30. The thermally induced strain on the solder ball 28 generated during thermal cycles are distributed over the height L. The intent of the present invention is to modify the substrate 22 and/or the board 32 so as to redistribute the strain over a height greater than L in order to increase the fatigue life of the configuration of FIG. 1.

Figure 2:
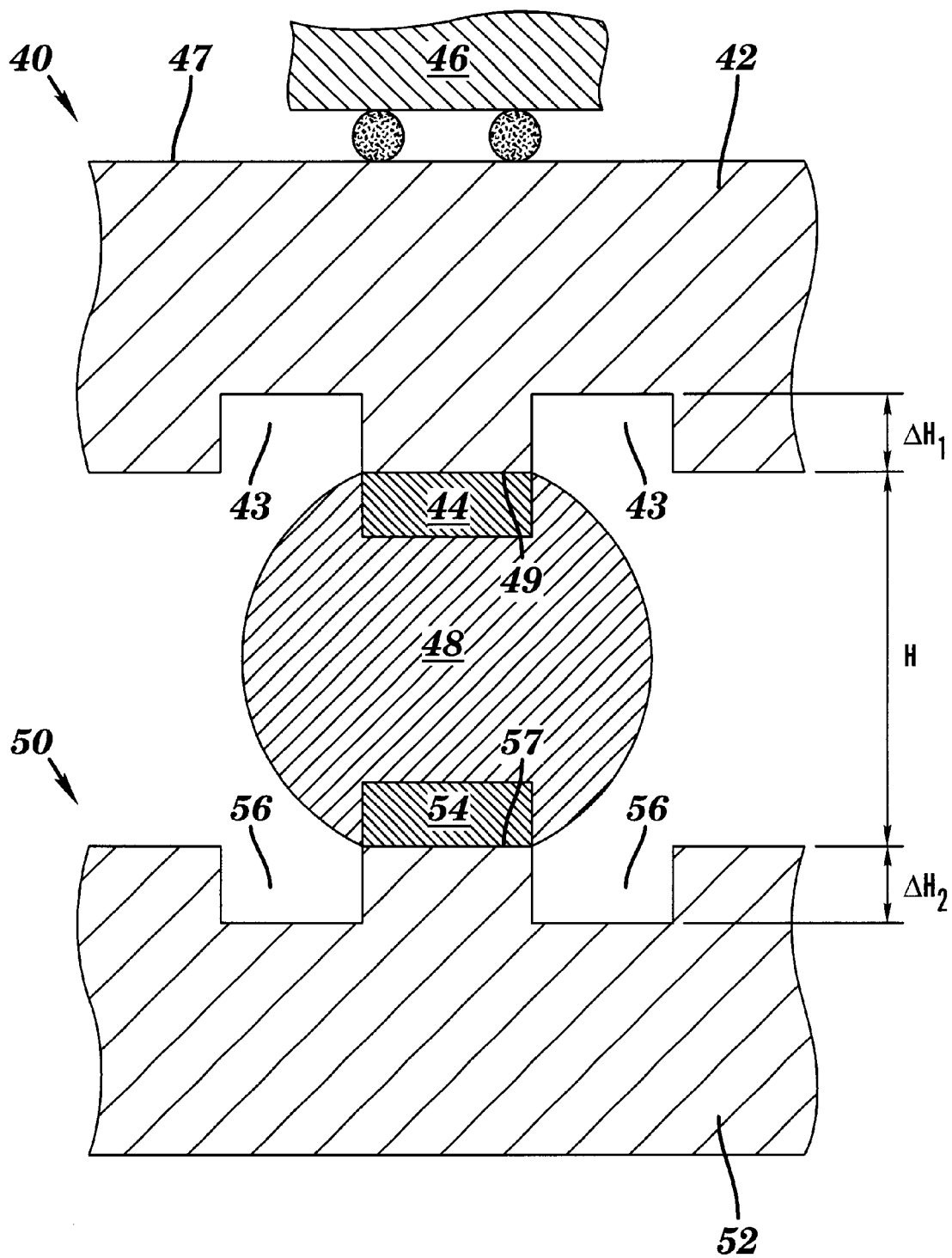
FIG. 2 depicts a front cross-sectional view of a BGA module attached to a circuit card, with void regions surrounding dielectric material under both the BGA pad and the circuit card pad, in accordance with the present invention.

FIG. 2 illustrates an embodiment of the present invention that increases the effective height over which the strain is distributed when compared with the configuration of FIG. 1. FIG. 2 shows a front cross-sectional view of a BGA module 40 attached to a circuit card 50. The BGA module 40 comprises a dielectric substrate 42, a chip 46 attached to a top side 47 of the substrate 42, a BGA pad 44 attached to a bottom side 49 of the substrate 42, and a solder ball 48 of height H is attached to the BGA pad 44. The solder ball 48 may be attached to the BGA pad 44, inter alia, prior to the chip 46 being attached to the top side 47 of the substrate 42. The circuit card 50 comprises a dielectric board 52 and a circuit card pad 54 attached to a top side 57 of the board 52. The solder ball 48 is attached to the circuit card pad 54, thereby connecting the BGA module 40 to the circuit card 50. An annular void 43 of height $\Delta H_1$ within the substrate 42 surrounds substrate material underneath the BGA pad 44. An annular void 56 of height $\Delta H_2$ within the board 52 surrounds board material underneath the circuit card pad 54. Without the annular voids 43 and 56, the thermally induced strain would be distributed over height H in accordance with the prior art. With the annular voids 43 and 56 of the present invention, however, the deformation is distributed over the greater height $H+\Delta H_1+\Delta H_2$, thereby reducing the strain throughout the solder ball 48. The annular voids 43 and 56 respectively provide space so that the substrate material underneath the BGA pad 44 and the board material underneath the circuit card pad 54 are less constrained, thereby increasing their compliance and alleviating the thermally induced strain in the solder ball 48.

Figure 3:
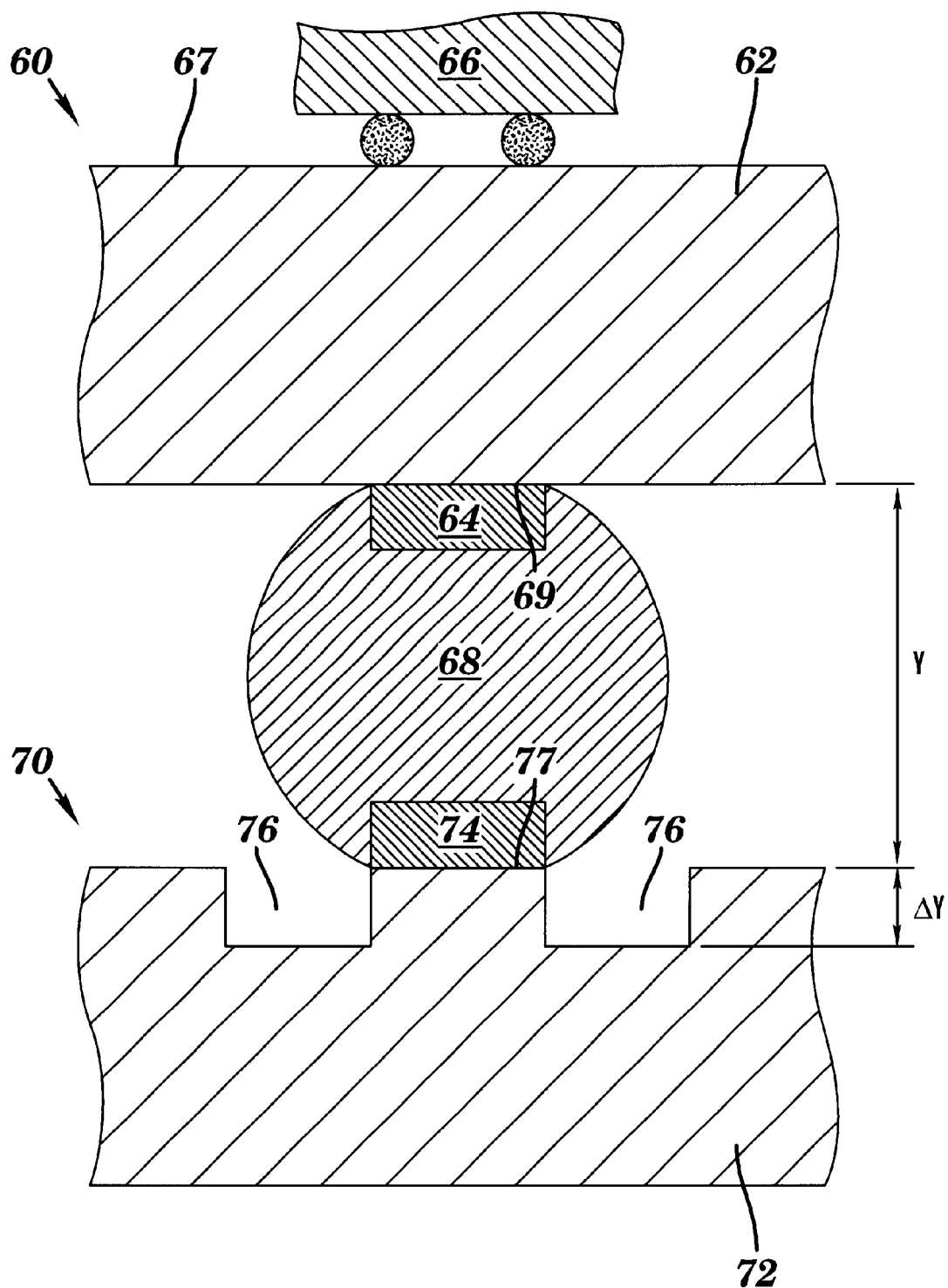
FIG. 3 depicts a front cross-sectional view of a BGA module attached to a circuit card, with a void region surrounding dielectric board material under the circuit card pad, in accordance with the present invention.

FIG. 3 illustrates an embodiment of the present invention that increases the effective height over which thermal strain is distributed relative to the configuration of FIG. 1. FIG. 3 shows a front cross-sectional view of a BGA module 60 attached to a circuit card 70. The BGA module 60 comprises a dielectric substrate 62, a chip 66 attached to a top side 67 of the substrate 62, a BGA pad 64 attached to a bottom side 69 of the substrate 62, and a solder ball 68 of height Y that is attached to the BGA pad 64. The circuit card 70 comprises a dielectric board 72 and a circuit card pad 74 attached to a top side 77 of the board 72. The solder ball 68 is attached to the circuit card pad 74, thereby connecting the BGA module 60 to the circuit card 70. An annular void 76 of height $\Delta Y$ within the board 72 surrounds board material underneath the circuit card pad 74. Without the annular void 76, the thermally induced strain would be distributed over height Y in accordance with the prior art. With the annular void 76 of the present invention, however, the deformation is distributed over the greater height $Y+\Delta Y$, thereby reducing the strain throughout the solder ball 68. The annular void 76 provides space so that the substrate material underneath the circuit card pad 74 is less constrained, thereby increasing its compliance and alleviating the thermally induced strain in the solder ball 68.

Figure 4:
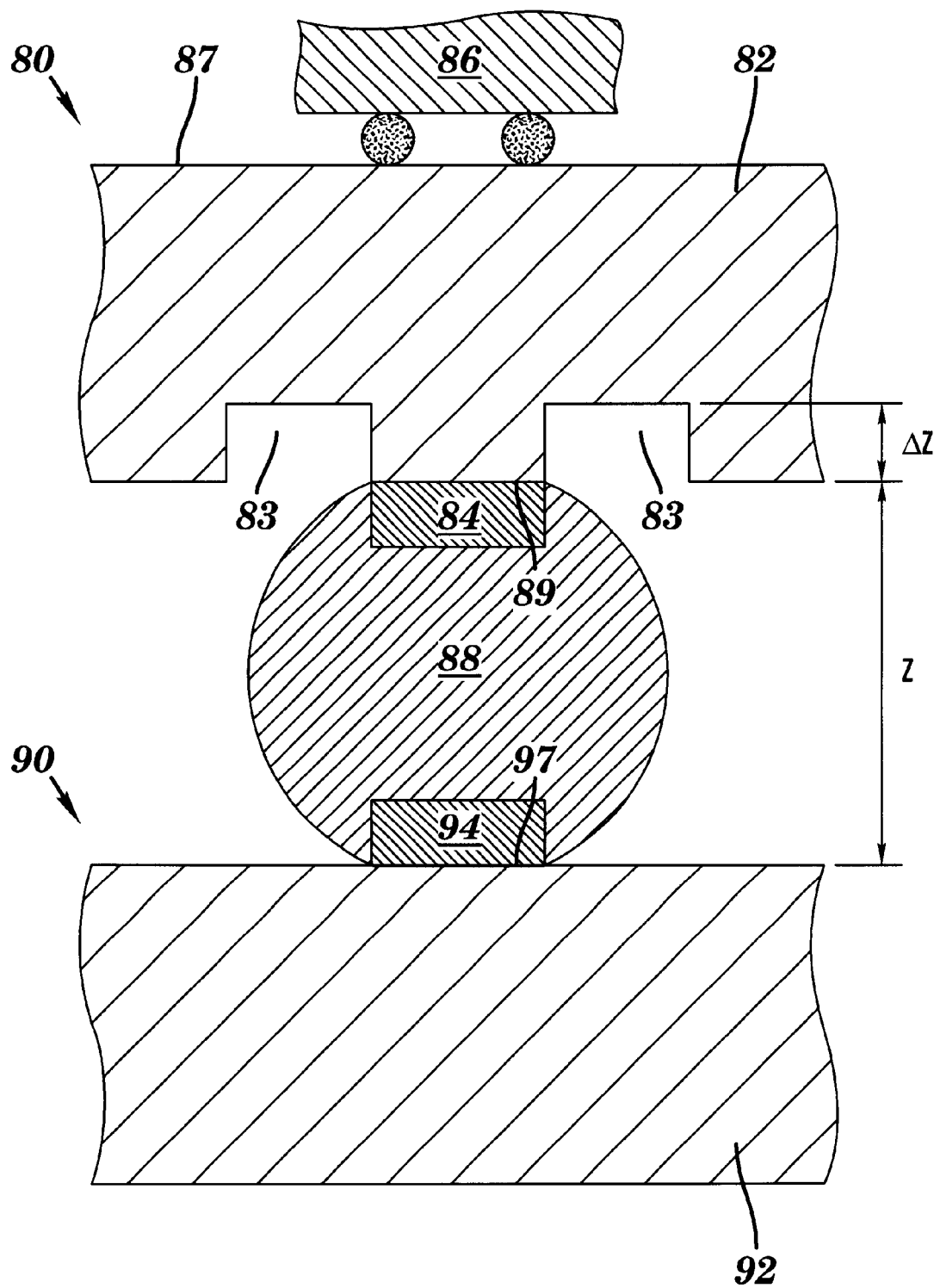
FIG. 4 depicts a front cross-sectional view of a BGA module attached to a circuit card, with a void region surrounding dielectric substrate material under the BGA pad, in accordance with the present invention.

FIG. 4 illustrates an embodiment of the present invention that increases the effective height over which strain is distributed when compared with the configuration of FIG. 1. FIG. 4 shows a front cross-sectional view of a BGA module 80 attached to a circuit card 90. The BGA module 80 comprises a dielectric substrate 82, a chip 86 attached to a top side 87 of the substrate 82, a BGA pad 84 attached to a bottom side 89 of the substrate 82, and a solder ball 88 of height Z that is attached to the BGA pad 84. The circuit card 90 comprises a dielectric board 92 and a circuit card pad 94 attached to a top side 97 of the board 92. The solder ball 88 is attached to the circuit card pad 94, thereby connecting the BGA module 80 to the circuit card 90. An annular void 83 of height $\Delta Z$ within the substrate 82 surrounds substrate material underneath the BGA pad 84. Without the annular void 83, the thermally induced strain is distributed over height Z in accordance with the prior art. With the annular void 83 of the present invention, however, the thermal shear stresses are distributed over the greater height $Z+\Delta Z$, thereby reducing the strain throughout the solder ball 88.

The annular void 83 provides space so that the substrate material underneath the circuit card pad 84 is less constrained, thereby increasing its compliance and alleviating the thermally induced strain in the solder ball 88.

If an annular void in FIGS. 2–4 substantially but not totally surrounds dielectric material underneath a pad, a peninsula of dielectric material under the pad will have been defined by the annular void. Alternatively, if an annular void in FIGS. 2–4 totally surrounds dielectric material underneath a pad, an island of dielectric material under the pad will have been defined by the annular void.

Figure 5:
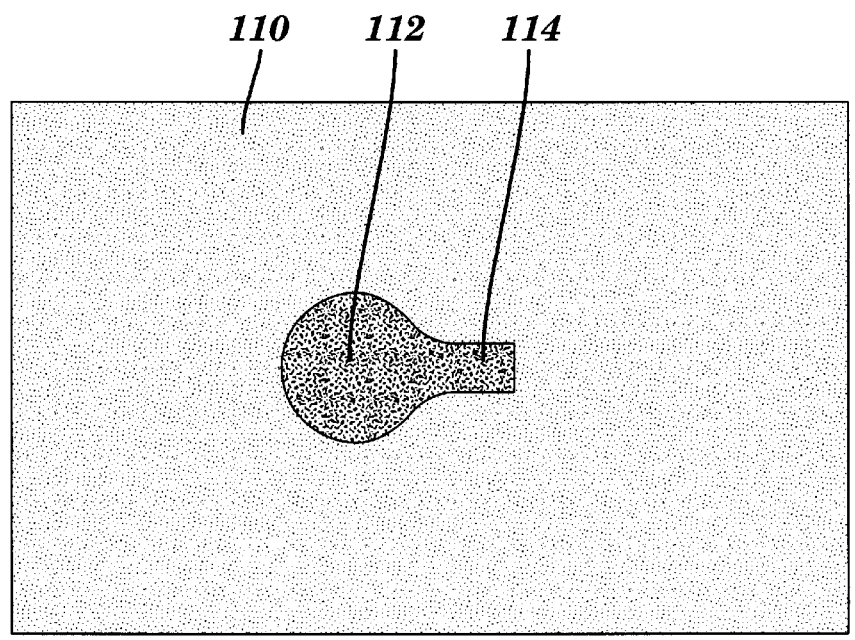
FIG. 5 depicts a top view of a substrate having a pad with a connecting strip, in accordance with the present invention.
Figure 6:
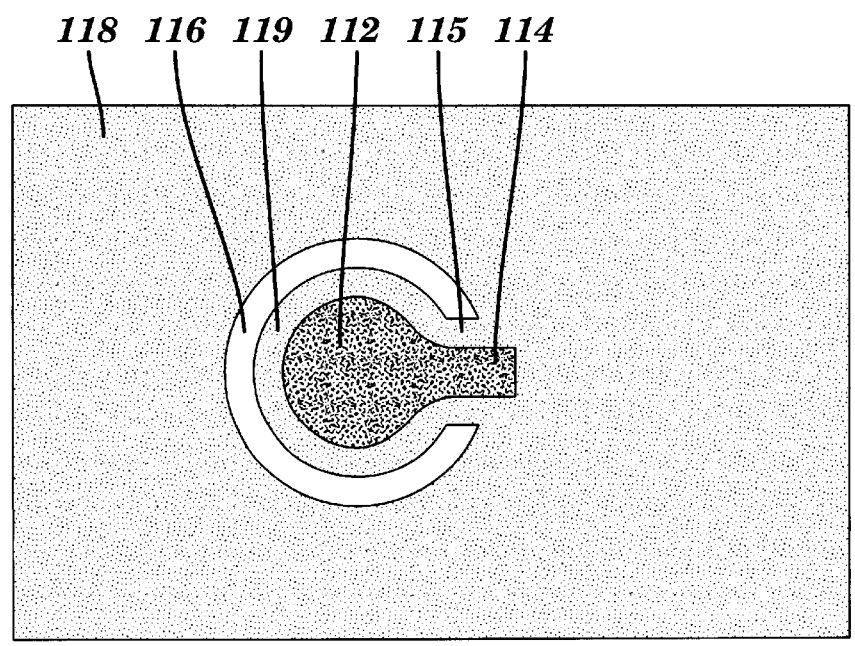
FIG. 6 depicts FIG. 5 with a void region substantially, but not totally, surrounding dielectric material underneath the pad.
Figure 7:
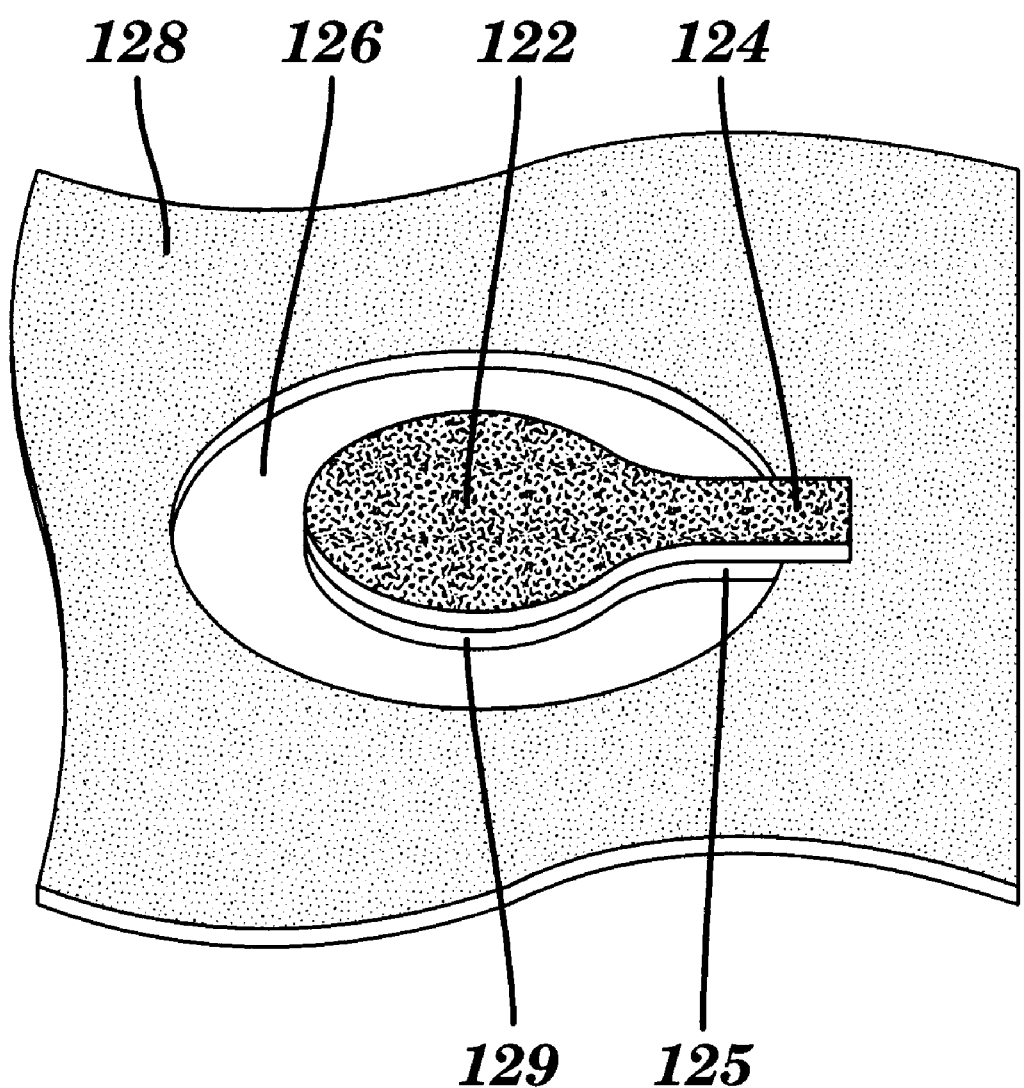
FIG. 7 depicts a top perspective view of a substrate with a void region substantially, but not totally, surrounding dielectric material underneath a pad on the substrate.
Figure 8:
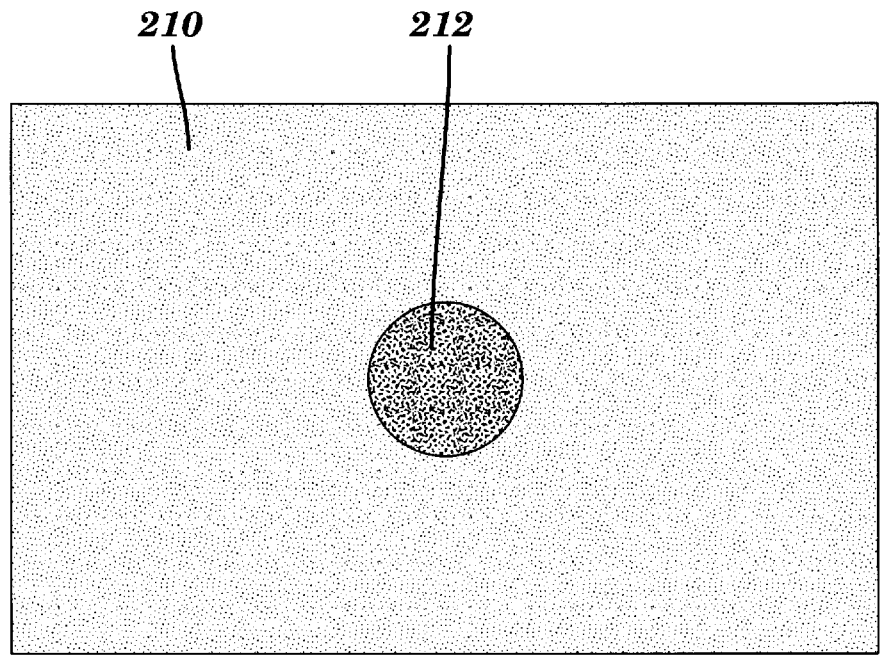
FIG. 8 depicts a top view of a substrate having a pad, in accordance with the present invention.

FIGS. 5–7 illustrates a process of the present invention which forms an annular void that substantially but not totally surrounds dielectric material under a pad to create a peninsula of dielectric material. The process begins with the configuration of FIG. 5, which shows a top view of a pad 112 on a substrate 110 with a wiring pattern 114 that is attached to the pad 112. The substrate 110 represents either a dielectric substrate of a BGA module, or a dielectric board of a circuit card, as described for FIGS. 1–3. Next, FIG. 6 shows the result of forming an annular void 116 that substantially but not totally surrounds dielectric material underneath the pad 112. As a result, a peninsula 119 of dielectric material is created under the pad 112, wherein a strip 115 of dielectric substrate material connects the peninsula 119 to the remainder 118 of the substrate 110 (see FIG. 5 for substrate 110). The strip 115 serves to mechanically support the wiring pattern 114, which electrically couples the pad 112 to the substrate 110 or to internal circuitry of the BGA module or circuit card that comprises the substrate 110.

The peninsula 119 is shown in FIG. 6 to comprise a larger area than the area of pad 112 which rests on the peninsula 119. FIG. 7 shows a perspective view of an alternative configuration of a substrate 128 with an annular void 126 that substantially but not totally surrounds a peninsula 129 of substrate material, wherein the area of the peninsula 129 is approximately the same as the area of the pad 122 that rests on the peninsula 129. A strip 125 of dielectric substrate material connects the peninsula 129 to the substrate 128 and serves to mechanically support a wiring pattern 124 that is attached to the pad 122. The wiring pattern 124 electrically couples the pad 122 to the substrate 128 or to internal circuitry of the BGA module or circuit card that comprises the substrate 128.

Figure 9:
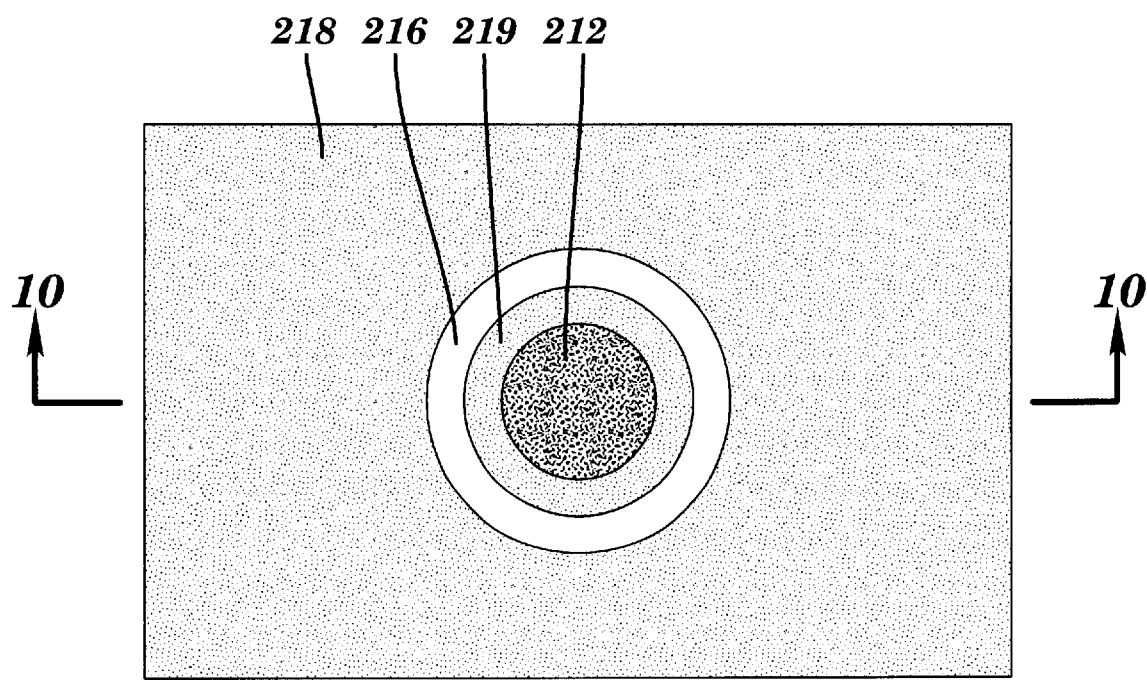
FIG. 9 depicts FIG. 8 with a void region surrounding dielectric material underneath the pad.
Figure 10:
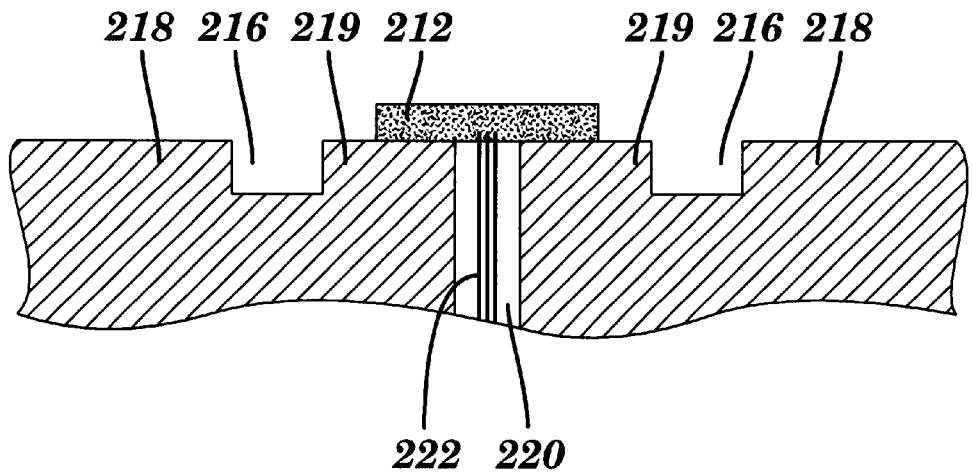
FIG. 10 depicts a cross-sectional side view of the configuration of FIG. 9, showing a wiring pattern that is routed to the pad.

FIGS. 8–11 illustrates a process of the present invention which forms an annular void that totally surrounds dielectric material under a pad to create an island of dielectric material. The process begins with the configuration of FIG. 8, which shows a top view of a pad 212 on a substrate 210. The substrate 210 represents either a dielectric substrate of a BGA module, or a dielectric board of a circuit card, as described for FIGS. 1–3. Next, FIG. 9 shows the result of forming an annular void 216 that totally surrounds dielectric material underneath the pad 212. As a result, an island 219 of dielectric material is created under the pad 212, leaving a remainder 218 of the substrate 210 (see FIG. 8 for substrate 210). FIG. 10 illustrates a cross-sectional view of the configuration of FIG. 9, showing a wiring pattern 222 within a via 220, wherein the via 220 is contained within the island 219. The wiring pattern 222 is routed upward to connect the pad 212 with internal circuitry of the BGA module or circuit card that comprises the substrate 210.

Figure 11:
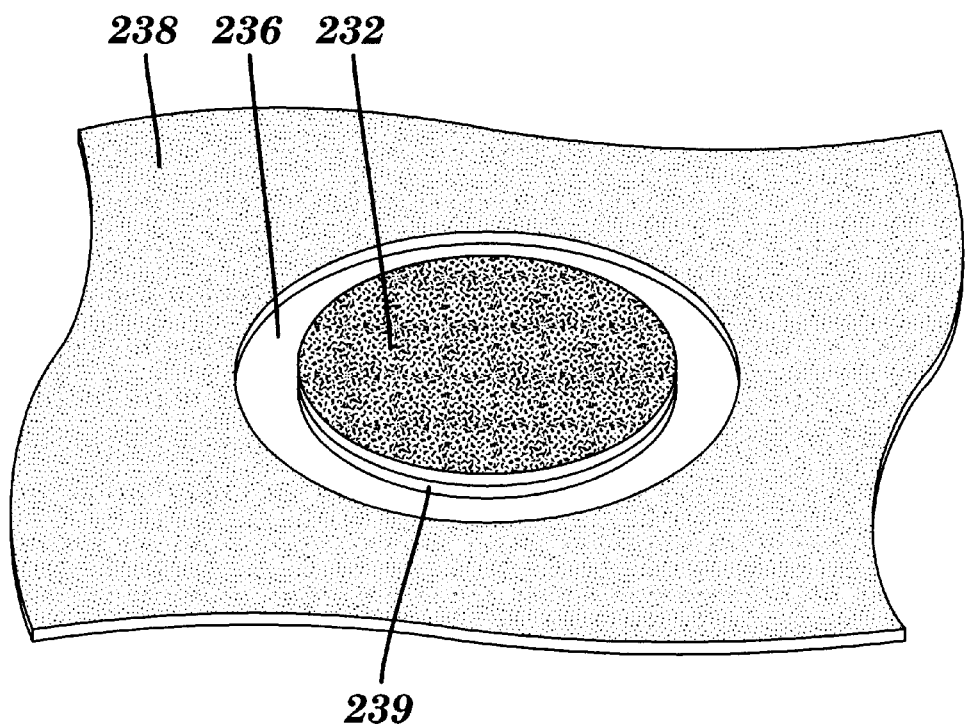
FIG. 11 depicts a top perspective view of a substrate with a void region totally surrounding dielectric material underneath a pad on the substrate.

The island 219 is shown in FIG. 9 to comprise a larger area than the area of pad 212 which rests on the island 219. FIG. 11 shows a perspective view of an alternative configuration of a substrate 238 with an annular void 236 that totally surrounds an island 239 of substrate material, wherein the area of the island 239 is approximately the same as the area of the pad 232 that rests on the island 239. There is a wiring pattern (not shown) similar to that in FIG. 10, wherein the wiring pattern is within a via that is contained within the island 239, and wherein the wiring pattern is routed upward to connect the pad 232 with internal circuitry of the BGA module or circuit card that comprises the substrate 238.

The annular voids of the present invention in FIGS. 2–11 may be formed by any method known to those of ordinary skill in the art. In particular, the annular voids my be formed by laser ablation using any one of various types of lasers as are known to those skilled in the art. A practical laser for this purpose is a frequency tripled Neodumuim YAG laser using ultraviolet emission, high peak power, high repetition rate, and a focused beam of 6 to 50 $\mu$m in diameter. Generally, dielectric polymers absorb best at ultraviolet energies and the thermal damage to the nonablated portions is minimal. A useful wave length in the ultraviolet range is 355 mn. Because the areas to be scanned are usually larger than the beam size, a raster scan may be created to cover the area to be scanned. Scan spacing is typically 80% of the spot size in order to provide some overlap of the guassian beam. Depending on the material, repetition rates of 1,000 Hz to 20,000 Hz can be utilized, with the 1,000 Hz rate providing the highest power per pulse of 12 KW which drops to 0.5 KW at 20,000 Hz. An example of a specific process is ablating a circular pad on a carrier made of a glass-cloth reinforced epoxy material such as FR-4, with a 14 $\mu$m beam scanned over the target area at 2,000 Hz, 8.3 KW per pulse, and a pulse spacing of 11 $\mu$m. Each scan pass removes approximately 20 $\mu$m of material. To remove 200 $\mu$m (0.008 inch), 10 scan passes would be needed. As an alternative to the preceding Neodumuim YAG laser, other laser technologies (e.g., $CO_2$ and Excimer) can be used to achieve similar results.

Although the preferred embodiments described herein pertain to annular void regions surrounding dielectric matter underneath a pad on a BGA module or on a circuit card, the present invention applies to any configuration having annular void regions surrounding dielectric matter underneath a pad on a dielectric substrate.

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method for forming at least one electrical structure, comprising the steps of:

providing a substrate including a dielectric layer having a first surface, and at least one electrically conductive pad attached to the first surface; and removing a first portion of the dielectric layer to form a void portion of the dielectric layer, wherein the void portion substantially surrounds a second portion of the dielectric layer, and wherein the pad is positioned on the second portion.

2. The method of claim 1, wherein the removing step is accomplished by using a laser.

3. The method of claim 1, wherein the removing step results in a strip of the dielectric layer connecting the second portion to a remaining portion of the dielectric layer.

4. The method of claim 1, wherein the removing step results in the void portion totally surrounding the second portion.

5. The method of claim 3, wherein the providing step further comprises providing an internal wiring pattern that is electrically connected to the pad, and wherein the removing step results in the strip being underneath a portion of the internal wiring pattern.

6. The method of claim 4, wherein the providing step further comprises providing an internal wiring pattern that is electrically connected to the pad, and wherein a portion of the internal wiring pattern is contained within a via that is located underneath the pad.

7. The method of claim 1, wherein the providing step further comprises providing an internal wiring pattern that is electrically connected to the pad, and wherein the removing step does not remove any portion of the internal wiring pattern.

8. The method of claim 7, further comprising the following steps for forming a ball grid array module:

providing a solder ball;

attaching the solder ball to the pad; and affixing a chip to a second surface of the dielectric layer, wherein the chip is electrically connected to the internal wiring pattern.

9. The method of claim 8, wherein the affixing step is performed prior to the attaching step.

10. The method of claim 8, further comprising fastening the ball grid array module to a circuit card.

11. The method of claim 8, further comprising:

forming a first electrical structure of the at least one electrical structure, wherein the providing step provides a first pad of the at least one electrically conductive pad; and affixing the ball grid array module to the first electrical structure by affixing the solder ball to the first pad.

12. The method of claim 11, wherein the forming of the first electrical structure precedes the forming of the ball grid array module.

13. At least one electrical structure, comprising:

a substrate including a dielectric layer having a first surface;

at least one electrically conductive pad attached to the first surface; and a void portion of the dielectric layer, wherein the void portion substantially surrounds a second portion of the dielectric layer, and wherein the pad is positioned on the second portion.

14. The electrical structure of claim 13, wherein a strip of the dielectric layer connects the second portion to a remaining portion of the dielectric layer.

15. The electrical structure of claim 13, wherein the void portion totally surrounds the second portion.

16. The electrical structure of claim 14, further comprising an internal wiring pattern that is electrically connected to the pad, wherein the strip is underneath a portion of the internal wiring pattern.

17. The electrical structure of claim 15, further comprising an internal wiring pattern that is electrically connected to the pad, wherein a portion of the internal wiring pattern is contained within a via that is located underneath the pad.

18. The electrical structure of claim 13, further comprising an internal wiring pattern that is electrically connected to the pad.

19. The electrical structure of claim 18, wherein the electrical structure is a ball grid array module such that the electrical structure further comprises:

a solder ball attached to the pad; and a chip attached to a second surface of the dielectric layer, wherein the chip is electrically connected to the internal wiring pattern.

20. The electrical structure of claim 19, further comprising the ball grid array module affixed to a circuit card.

21. The electrical structure of claim 19, further comprising:

a first electrical structure of the at least one electrical structure, wherein the first electrical structure comprises a first pad of the at least one electrically conductive pad, and wherein the ball grid array module is affixed to the first electrical structure such that the solder ball is affixed to the first pad.

* * * * *